United States Patent [19]

Moresco et al.

[11] Patent Number: 5,426,563
[45] Date of Patent: Jun. 20, 1995

[54] THREE-DIMENSIONAL MULTICHIP MODULE

[75] Inventors: Larry L. Moresco, San Carlos; David A. Horine, Los Altos; Wen-Chou V. Wang, Cupertino, all of Calif.

[73] Assignee: Fujitsu Limited, Japan

[21] Appl. No.: 157,332

[22] Filed: Nov. 22, 1993

Related U.S. Application Data

[63] Continuation of Ser. No. 925,962, Aug. 5, 1992, abandoned.

[51] Int. Cl.6 .................................................. H05F 7/20
[52] U.S. Cl. ..................................... 361/689; 361/775; 361/790
[58] Field of Search ............... 361/689, 699, 721, 749, 361/775, 784, 785, 789, 790, 792, 794, 795; 257/712–714; 439/65, 67–69, 74, 77; 165/80.3, 80.4

[56] References Cited

U.S. PATENT DOCUMENTS

| | | | |
|---|---|---|---|
| 3,643,135 | 2/1972 | Devore et al. | 317/101 D |
| 3,949,274 | 4/1976 | Anacker | 317/101 |
| 4,202,007 | 5/1980 | Dougherty et al. | 357/80 |
| 4,489,363 | 12/1984 | Goldberg | 361/383 |
| 4,499,607 | 2/1985 | Higgins | 455/606 |
| 4,502,098 | 2/1985 | Brown et al. | 361/383 |
| 4,525,921 | 7/1985 | Carson et al. | 29/577 |
| 4,574,393 | 3/1986 | Smolley | 361/393 |
| 4,581,679 | 4/1986 | Smolley | 361/395 |
| 4,631,636 | 12/1986 | Andrews | 361/385 |
| 4,638,348 | 1/1987 | Brown et al. | 357/74 |
| 4,640,010 | 2/1987 | Brown | 29/832 |
| 4,688,151 | 8/1987 | Kraus | 361/405 |
| 4,695,872 | 9/1987 | Chatterjee | 357/75 |
| 4,718,163 | 1/1988 | Berland et al. | 29/837 |
| 4,727,410 | 2/1988 | Higgins, III | 357/74 |
| 4,733,461 | 3/1988 | Nakano | 29/830 |
| 4,739,444 | 4/1988 | Zushi et al. | 361/383 |
| 4,770,640 | 9/1988 | Walter | 439/69 |
| 4,771,366 | 9/1988 | Blake et al. | 361/387 |
| 4,774,630 | 9/1988 | Reisman et al. | 361/383 |
| 4,801,992 | 1/1989 | Golubic | 357/40 |
| 4,803,595 | 2/1989 | Kraus et al. | 361/412 |
| 4,807,021 | 2/1989 | Okumura | 357/75 |
| 4,811,082 | 3/1989 | Jacobs et al. | 357/80 |
| 4,841,355 | 6/1989 | Parks | 357/82 |
| 4,855,809 | 8/1989 | Malhi et al. | 357/75 |
| 4,858,073 | 8/1989 | Gregory | 361/388 |
| 4,862,249 | 8/1989 | Carlson | 357/80 |

(List continued on next page.)

FOREIGN PATENT DOCUMENTS

| | | | |
|---|---|---|---|
| 0506225 | 9/1992 | European Pat. Off. | H01L 23/538 |
| 2096541 | 2/1972 | France | H01L 1/100 |
| 216826 | 12/1984 | Germany . | |

(List continued on next page.)

OTHER PUBLICATIONS

"Power Grid Image For Embedded Arrays," IBM Technical Disclosure Bulletin, vol. 32, No. 8B, Jan. 1990.

(List continued on next page.)

Primary Examiner—Gerald P. Tolin
Attorney, Agent, or Firm—McCubbrey, Bartels & Ward

[57] ABSTRACT

A three dimensional module for housing a plurality of integrated circuit chips is shown. The IC chips are mounted in rows on a plurality of substrates. Parallel to each row are communications bars which provide signal paths allowing chips on one substrate to communicate with those on another substrate. The communications bars also serve as spacers between substrates, thereby forming cooling channels. The IC chips are disposed in the cooling channels so that they come into direct contact with the cooling fluid. Signal lines to and from the IC chips are kept as separated as possible from the power lines so as to minimize noise. To this end, relatively thick power supply straps are mounted to each substrate below each row of IC chips. The power supply straps are, in turn, connected to power feed straps such that a very low impedance power supply path to the IC chips is maintained. The overall design of the three dimensional structure of the present invention is highly modular to facilitate high yield fabrication and repair.

28 Claims, 8 Drawing Sheets

U.S. PATENT DOCUMENTS

| Patent # | Date | Inventor | Class |
|---|---|---|---|
| 4,868,712 | 9/1989 | Woodman | 361/388 |
| 4,871,317 | 10/1989 | Jones | 439/68 |
| 4,884,167 | 11/1989 | Mine | 361/382 |
| 4,894,706 | 1/1990 | Sato et al. | 357/72 |
| 4,902,637 | 2/1990 | Kondou et al. | 437/51 |
| 4,922,378 | 5/1990 | Malhi et al. | 361/387 |
| 4,930,002 | 5/1990 | Takenaka et al. | 357/75 |
| 4,937,659 | 6/1990 | Chall, Jr. | 357/74 |
| 4,937,707 | 6/1990 | McBride | 361/398 |
| 4,939,568 | 7/1990 | Kato et al. | 357/75 |
| 4,953,005 | 8/1990 | Carlson et al. | 357/80 |
| 4,953,060 | 8/1990 | Lauffer | 361/388 |
| 4,956,695 | 9/1990 | Robinson et al. | 357/74 |
| 4,956,746 | 9/1990 | Gates, Jr. | 361/385 |
| 4,958,258 | 9/1990 | Charruau | 361/386 |
| 4,970,577 | 11/1990 | Ogihara et al. | 357/74 |
| 4,983,533 | 1/1991 | Go | 437/7 |
| 4,984,132 | 1/1991 | Sakurai | 361/414 |
| 4,991,000 | 2/1991 | Bone et al. | 357/75 |
| 4,992,908 | 2/1991 | Solomon | 361/400 |
| 4,996,587 | 2/1991 | Hinrichsmeyer et al. | 357/74 |
| 5,003,376 | 3/1991 | Iversen | 357/74 |
| 5,006,920 | 4/1991 | Schafer et al. | 357/74 |
| 5,006,925 | 4/1991 | Bregman et al. | 357/82 |
| 5,007,841 | 4/1991 | Smolley | 439/66 |
| 5,016,138 | 5/1991 | Woodman | 361/381 |
| 5,019,945 | 5/1991 | Smolley | 361/412 |
| 5,025,306 | 6/1991 | Johnson et al. | 357/75 |
| 5,031,072 | 7/1991 | Malhi et al. | 361/387 |
| 5,032,896 | 7/1991 | Little et al. | 357/75 |
| 5,049,982 | 9/1991 | Lee et al. | 357/81 |
| 5,051,865 | 9/1991 | Kato | 361/386 |
| 5,053,856 | 10/1991 | Davidson | 357/82 |
| 5,060,116 | 10/1991 | Grobman et al. | 361/474 |
| 5,061,990 | 10/1991 | Arakawa et al. | 357/80 |
| 5,065,277 | 11/1991 | Davidson | 361/383 |
| 5,081,563 | 1/1992 | Feng et al. | 361/414 |
| 5,121,297 | 6/1992 | Haas | 361/398 |
| 5,177,594 | 1/1993 | Chance et al. | 257/678 |

FOREIGN PATENT DOCUMENTS

| Patent # | Date | Country | Class |
|---|---|---|---|
| 61-99361A | 5/1986 | Japan | H01L 25/04 |
| 61-101067A | 5/1986 | Japan | H01L 25/04 |
| 61-168951A | 7/1986 | Japan | H01L 25/04 |
| 1-136360A | 5/1989 | Japan | H01L 23/52 |
| 2-199859A | 8/1990 | Japan | H01L 25/04 |
| 2250138 | 5/1992 | United Kingdom | H05K 1/02 |
| WO92/03035 | 2/1992 | WIPO | H05K 7/20 |

OTHER PUBLICATIONS

Val, et al., "3-D Interconnection for Ultra-Dense Multichip Modules," *IEEE Transactions On Components, Hybrids, and Manufacturing Technology*, vol. 13, No. 4, Dec. 1990.

Andrews, "Parallel Printed Circuit Manifold," *Motorola Technical Developments*, vol. 7, Oct. 1987.

Iverson, "Next Generation Power Electronics for Space and Aircraft Part II—Packaging," *Proceedings of the 26th Intersociety Energy Conversion Engineering Conference*, IECEC-91, Aug. 4–9, 1991.

Tummala, et al., *Microelectronics Packaging Handbook*, New York: Van Nostrand Reinhold, 1989 pp. 955–974; 1034–1038; 1071–1076.

Richard C. Dorf, ed. *The Electrical Engineering Handbook*, Boca Raton: CRC Press, 1993, pp. 499–529.

Scott S. Simpson, "INVISICON ® The Invisible Interconnection ™—A connection system with high contact density and controlled impedance," Rogers Corporation, Product Information Brochure, date unknown.

Moresco, "System Interconnect Issues for Sub-Nanosecond Signal Transmission," *Proceedings of the International Symposium on Advanced in Interconnection and Packaging*, SPIE, Nov. 5, 1990, pp. 202–213.

Nagesh, et al., "A Comparative Study of Interconnect Technologies," *Proceedings of the 9th International Electronics Packaging Conference*, vol. I (1989), from *MULTICHIP MODULES* by IEEE, Inc. 1991, pp. 557–566.

Liu, et al., "Integrated Circuit Chip Package," IBM Technical Disclosure Bulletin, vol. 17, No. 7, Dec. 1974.

THREE-DIMENSIONAL MULTICHIP MODULE

This application is a continuation of application Ser. No. 07/925,962, filed Aug. 5, 1992, now abandoned.

FIELD OF THE INVENTION

The invention is in the field of integrated circuit chip packaging technology, and is particularly related to structures for housing a plurality of integrated circuit chips in a three dimensional array.

BACKGROUND OF THE INVENTION

Integrated circuit (IC) "chips" comprising very large numbers of electronic components have become ubiquitous in modern society. Electronic devices and components of all sorts, from central processing units used in all levels of computing, to highly specialized controllers used to control various types of equipment and machinery, are now routinely available as integrated circuit chips. Since the introduction of the first IC chips, there has been a remarkable increase in the number of devices contained on a single chip, as well as a corresponding dramatic reduction in the size of the individual electronic components formed on the chip. Device geometries with line widths of the order of one micron have become common so that individual IC chips now routinely contain in excess of a million electronic components. Even higher device densities are projected.

The increase in device complexity and the decrease in device size has, for many types of IC chips, sharply increased the complexity of forming interconnections between the chips and external devices. These factors, along with a third, related phenomenon, i.e., the increased speed at which many digital devices now function, have increased the heat per unit volume produced by many chips to the point where active cooling methods are required to avoid thermal damage.

Many devices, such as computers, utilize a large number of separate IC chips. For example a computer may have one or more central processing unit (CPU) chips, various memory chips, controller chips, input/output (I/O) device chips, etc. Traditionally, each chip is mounted in a separate package which is then connected to a printed circuit board, for example, a computer "motherboard", which supplies power to the chip and provides signal routing among the chips on the board and to various I/O devices. However, where an electronic device utilizes a substantial number of chips, packaging each chip separately greatly increases the total area of printed circuit board needed to interconnect all the chips. In addition, as device speed has increased, the distance between individual components has become an increasingly important factor, so that it is important, in many applications, to minimize the signal path between IC chips used in the system.

In order to overcome the aforementioned problems, many device makers have begun using "multichip modules", i.e., packages housing a plurality of individual IC chips. Typical multichip modules incorporate not only means for interconnecting the IC chips with external devices, but also means for interconnecting the IC chips within the module. A general introduction to multichip modules, including a discussion of the history of the development thereof, is described in the text entitled: *Multichip Modules: Systems Advantages, Major Constructions and Materials Technologies*, R. W. Johnson, et al., eds., IEEE Press (1991). Multichip modules significantly reduce the overall space needed to house the IC chips and, by shortening the distance between chips within the module, facilitate high speed device operation.

The first multichip modules were two-dimensional, i.e., all of the IC chips housed in the package were mounted on a planar substrate. Subsequently, three-dimensional multichip modules were developed, thereby permitting an even further increase in the density of IC chips that could be housed in a single package. However, increasing the number of IC chips housed in a relatively small area further increases the overall heat per unit volume generated by the chip array, while concurrently complicating techniques for actively cooling the chips. Likewise, placing a large number of high density chips in close proximity greatly complicates the task of supplying power to and routing signals to and from the chips. Many of the issues associated with three-dimensional multichip modules are described in a paper by one of the inventors hereof, entitled: "System interconnect issues for sub-nanosecond signal transmission," (L. Moresco) published in *Int'l Symposium on Advances in Interconnection and Packaging, Book 2—Microelectronic Interconnects and Packages: System and Process Integration*, S. K. Tewksbury, et al., eds., Proceedings of the Int'l Soc. for Optical Eng., SPIE Vol. 1390, (1990). In view of the complicating factors associated with three-dimensional arrays, two-dimensional multichip arrays remain the most common form of multichip modules in use today.

Two major substrate technologies have developed for handling the power supply and signal routing in multichip modules. Initially, co-fired ceramic substrate technology was used but gradually there has been a shift to thin film substrate technology. In either case, a plurality of IC chips are connected to a multilayered substrate which contains all the signal and power lines needed to supply power and to interconnect the chips to each other and to external devices. In order to make the required number of interconnections, such substrates are multilayered, sometimes containing dozens of individual layers. For example, even early ceramic substrate technology utilized as many as thirty-five separate layers in the multichip substrate. However, problems arise in placing signal lines in close proximity to each other and to power supply lines. The dielectric constant of the substrate material plays an important role in solving (or creating) these problems. As a result, ceramic technology has lost favor due to the high dielectric constant associated with the ceramic materials typically selected for use as a substrate material. Instead low dielectric thin film substrates made of materials such as polyimide have become more common.

In known multichip modules, the individual IC chips are embedded in an encasing material or otherwise sealed. In doing so, it is important that good thermal contact between the chip and the outside be maintained, so that heat does not build up in the chip. A variety of active cooling techniques have been applied to multichip modules, some of them quite elaborate. Frequently, cooling channels are formed in the substrate or elsewhere in the overall structure for forced passage of a cooling fluid. However, in all known devices, cooling of the chips relies on thermal transfer of the heat generated by the chip by conduction through a solid to one or more actively cooled surfaces remote from the chip. This approach is not highly efficient even when a solid with high thermal conductivity is used between the chip and the cooling surface. As a result, heat removal in high power, dense three-dimensional chip modules is still a serious problem.

Another problem with traditional approaches to packaging IC chips in multichip arrays is the method used for delivering power to the chips. As noted above, one aspect of this problem results from routing power lines through the same substrate utilized to carry signals to and from the chip. Equally important is the fact that the thinness of the substrates used in traditional multichip modules results in power feeds to the IC chips that have relatively high impedance. This high impedance results in undesired noise, power loss and excess thermal energy production.

Finally, fabrication yield is a very significant issue in the design and construction of complex multichip modules. In many designs, a failure in any individual component of the module will result in the entire module being useless.

Accordingly, it is an object of the present invention to provide a novel structure for a three-dimensional multichip module whereby the improved cooling of the individual integrated circuit chips is achieved.

Another object of the present invention is to improve the routing of signal and power lines to the integrated circuit chips in a multichip module.

Still another object of the present invention is to provide improved low impedance means for delivering power to the chips of a multichip module.

Yet another object of the present invention is to provide a three-dimensional multichip module design that is highly modular so that the individual components can be pretested prior to final assembly of the module, and such that at least some of said components are replaceable.

SUMMARY OF THE INVENTION

These and other objects that will become apparent to those skilled in the art after reading this specification along with the appended drawings and claims are realized in the present invention for a novel three-dimensional multichip module. In one aspect of the present invention a plurality of integrated circuit chips are mounted on a substrate and disposed in a cooling channel such that the individual IC chips come in direct contact with the cooling fluid as it moves through the cooling channel. In other embodiments of the invention, communication bars, used to interconnect integrated circuit chips mounted on different substrates, may also be mounted on each substrate such that when the substrates are stacked to form a three-dimensional array, the communication bars form walls of the cooling channels. Preferably, the integrated circuit chips are "flip chip" bonded to an intermediate substrate, which is positioned between the main substrate and the chip. These intermediate substrates may comprise various capacitors and resistors so that they are in extremely close proximity to the chips. In another aspect of the invention, the integrated circuit chips are, preferably, mounted in rows and low impedance power straps, separately fabricated from said substrate, are mounted below each row of chips on the opposite side of the substrate. These power straps may extend beyond the edges of the substrates where they are connected with power feed straps. Unique power strap structures are shown which provide low impedance, low noise, power distribution within the context of a structure which provides mechanical strain relief to the overall multichip module. Signal lines are connected to the three-dimensional module using edge connectors positioned at those edges of the substrates orthogonal to edges where the power is supplied. In this way, the power supply and signal connections to the chips are kept as separate as possible. In the preferred embodiment, each of the major components of the multichip module, i.e., the chips, the major substrates, the intermediate substrates, the communication bars, the power straps, the power feed straps, and the edge connectors are separately fabricated and can be pretested prior to final assembly. Likewise, as components are joined to form subcomponents, i.e., when a chip is mounted to an intermediate substrate, they are again tested before any further assembly. Many of the components are designed to be replaceable in the event of failure. Finally, the present invention includes a method of optimizing the number of IC chips mounted on each layer of the three dimensional module, and multichip modules constructed according to said method.

DETAILED DESCRIPTION

The present invention comprises a highly modular, three-dimensional multichip module for use in packaging a large number of integrated circuit "chips" in a dense array. A trend in modern digital IC technology is towards ever greater signal speeds, i.e., very high frequency operation. Many such devices now operate in the range of microwave frequencies, so that the physical distance between components can have a significant effect on the performance of the components. Accordingly, new IC chip packaging technologies have been developed to house multiple chips in very close proximity. The greatest chip densities are achieved in three-dimensional chip arrays.

In three-dimensional multichip modules, a plurality of individual IC chips are mounted in planar arrays, typically on a planar substrate, and the planar substrates are then stacked. For convenience, the x and y directions will be used to define the planar axes and the z direction will be used to define an axis which is orthogonal to the planar substrates, i.e., the z axis corresponds to the direction in which the substrates are stacked. In determining the optimal arrangement of chips in a three dimensional array, where chip-to-chip signal speed is a limiting factor, one must take into account the number of chips per functional unit in the module ($N_F$), the chip-to-chip pitch in the x and y directions ($P_x$, $P_y$), the layer-to-layer pitch in the z direction ($P_z$), and the number of functional units which need to communicate with other functional units ($N_s$). A functional unit is defined as being a collection of one or more chips which act as a unit, for example as a CPU, a controller, or the like. Assuming that all signal routing occurs in directions along the axes of the system, it can be shown that the optimum number of chips per board ($N_b$) can be calculated as follows:

$$N_b = [2 N_s N_F P_z V_{xy} / (P_x + P_y) V_z]^{\frac{1}{2}}$$

where $V_{xy}$ and $V_z$ are the velocity of electromagnetic wave transmission in the xy and z directions, respectively, and are dependent on the material used for electrical connection in the respective directions. This calculation proceeds with the assumption that, for a given number of chips per module, the distance (i.e., the length of the signal route) between any two chips is to be minimized. Generally speaking, it should be apparent that to minimize interchip distances, each of the layers should be generally square, and the overall module should be generally cubic if $V_{xy} = V_z$. If $P_x = P_y$ then, optimally, the number of chips disposed along the x and y axes of a substrate should be equal. Even when the number of chips to be mounted is small, the above equation will produce surprising results. For example, when using just four chips, it can be shown that, under typical circumstances, the optimal number of chips per board will be just one, i.e., it is best to simply stack the chips. However, the utility of the above equation is most significant where the number of chips is large, for example, in excess of ten.

While packing a plurality of chips in a three-dimensional array can be used to minimize the signal paths between chips in the array, the density achieved creates its own set of problems which must be addressed. By densely packing the IC chips in close proximity, the problem of heat removal becomes more significant. In addition, the greater density complicates the task of providing signal lines, and supplying power to the chips. Each of these concerns are addressed in the present invention as explained below.

Figure 1:
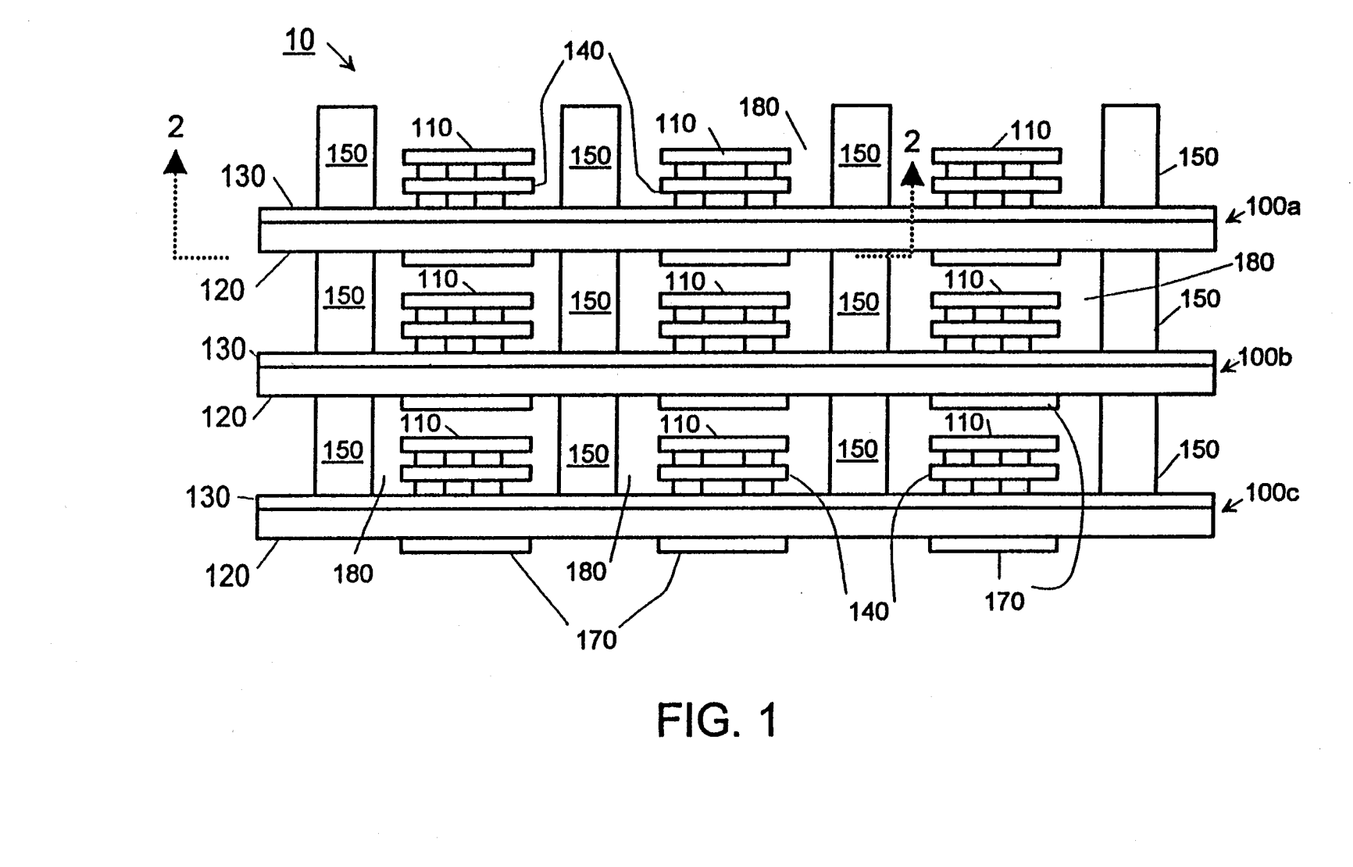
FIG. 1 is an elevation of a three-dimensional multichip module in accordance with one embodiment of the present invention.

Turning first to FIG. 1, an elevational view of a preferred embodiment of a multichip module 10 of the present invention is shown. The module comprises a plurality of substantially similar layers 100a, 100b, 100c, etc., upon which a plurality of integrated circuit chips 110 are mounted. Although three such layers are shown in FIG. 1, the preferred number of layers will vary according to the needs of a particular design, taking into account the optimization equation set forth above. Preferably, the IC chips contained on each layer are mounted in rows. Each layer 100 comprises a rigid substrate 120 upon which an active interconnect substrate 130 is formed or mounted. Rigid substrates 120 are primarily utilized to provide structural rigidity to the layer. Rigid substrates 120 may be made of any suitable material, such as ceramic, aluminum nitride, a sintered mixture of powdered copper/tungsten or even copper. It will be apparent to those skilled in the art that rigid substrate 120 should have a coefficient of thermal expansion which is not too dissimilar to that of active interconnect substrate 130 in order to avoid warpage or separation of the two due to thermal cycling.

In the preferred embodiment, active interconnect substrates 130 comprise a plurality of copper/polyimide (Cu/PI) layers containing signal paths for connecting the various chips in the multichip module. Cu/PI substrates are commonly used in multichip modules and the methods for designing and fabricating them are well known to those skilled in the art. However, as described below, there are aspects of the Cu/PI substrates 130 of the present invention which are non-conventional. The active interconnect substrate of the preferred embodiment of the present invention may contain as many as nine metal layers or more. The number of layers is dictated by the difficult topological problem of making all the necessary interconnects. Nonetheless, since the power lines are not routed across the plane of the interconnect substrate, as explained below, and since intermediate substrates are used to provide high frequency capacitors and terminal resistors, the number of layers in active interconnect substrate 130 is reduced in comparison to many prior art devices.

While active interconnect substrate 130 has been described as being constructed of Cu/PI in the preferred embodiment, those skilled in the art will appreciate that other methods and materials for making active interconnect substrates are available and are considered within the scope of the present invention.

Layers 100, each comprising a rigid substrate 120 and an active interconnect substrate 130, will generally be referred to herein as major substrates. In the preferred embodiment of the present invention, IC chips 110 are mounted upon intermediate substrates 140, rather than being directly mounted to a major substrate 100. Intermediate substrates 140 may also be referred to as interposing substrates or interposers. The intermediate substrates 140 preferably comprise various signal line terminal resistors and high frequency by-pass capacitors for ensuring that the signals delivered to the IC chips are terminated properly and that power is delivered "clean", i.e., free from noise. When operating at high frequencies, it is important that these components be situated very close to the IC chips to minimize parasitic effects. Positioning these components on an intermediate substrate, rather than incorporating them into the major substrate has the additional advantage of reducing the complexity of the major substrate, thereby simplifying the fabrication of major substrates 100 and adding modularity to the overall system.

Intermediate substrates 140 may be constructed using standard Cu/PI technology, or other known techniques capable of providing an adequate interconnect density and permitting the construction of the necessary terminal resistors and bypass capacitors.

Preferably, IC chips 110 are "flip chip" bonded to intermediate substrates 140, i.e., the chips are mounted with their active surfaces facing the intermediate substrate, thereby allowing increased interconnect density. Flip chip bonding is a well known technique that need not be described in detail. However, flip-chip bonding is not considered necessary to the present invention, and it will be apparent to those skilled in the art that other methods of bonding may be used without departing from the spirit or scope of the invention. Likewise, the use of intermediate substrates 140 is not considered fundamental to the present invention in its broadest aspects. While the invention is shown using one intermediate substrate for each of the chips mounted in the module, in an alternate embodiment several chips are mounted to a single intermediate substrate. Likewise, even when there are the same number of chips as intermediate substrates, it is not necessary that they be the same size, although such is preferred.

Figure 2:
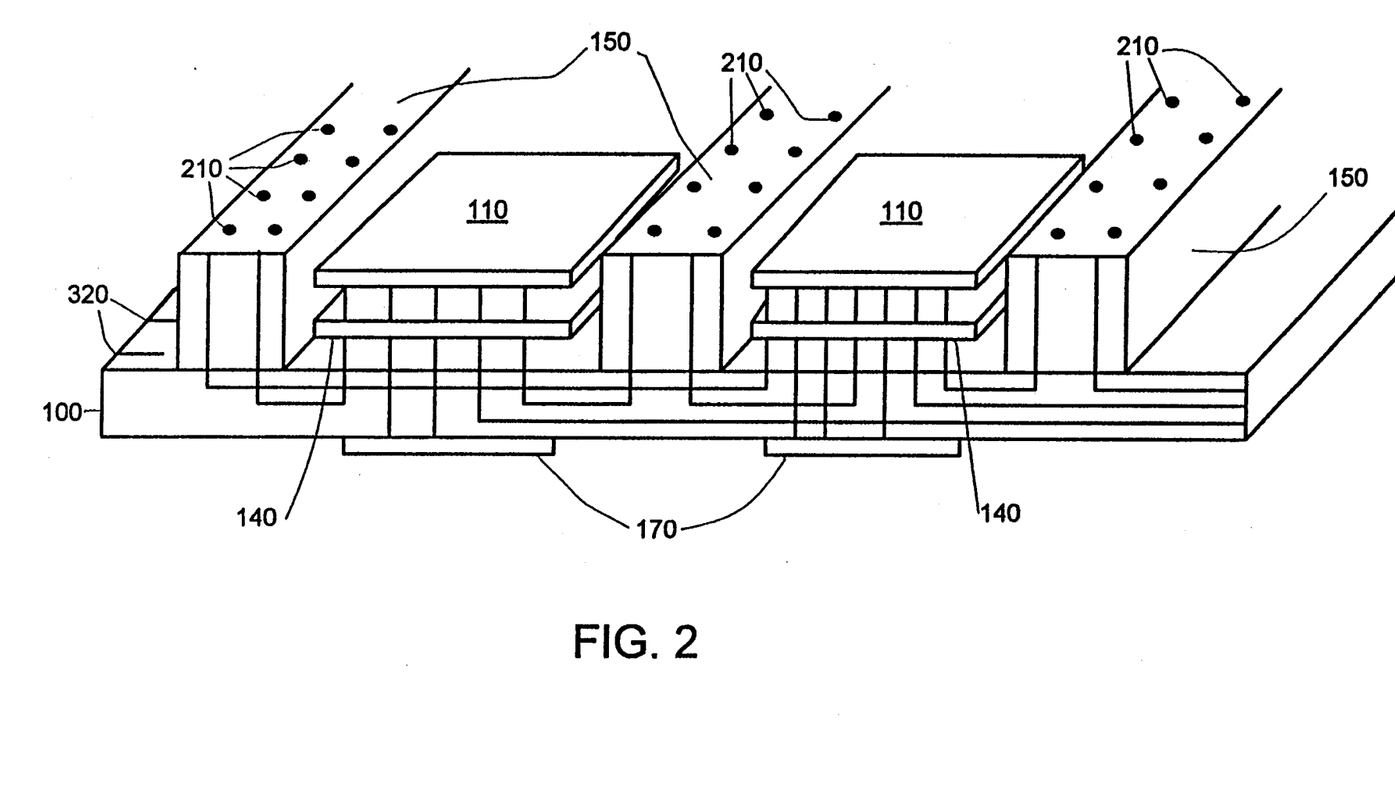
FIG. 2 is a perspective view of a partial cross-section of a single layer of a multichip module in accordance with the present invention.
Figure 4:
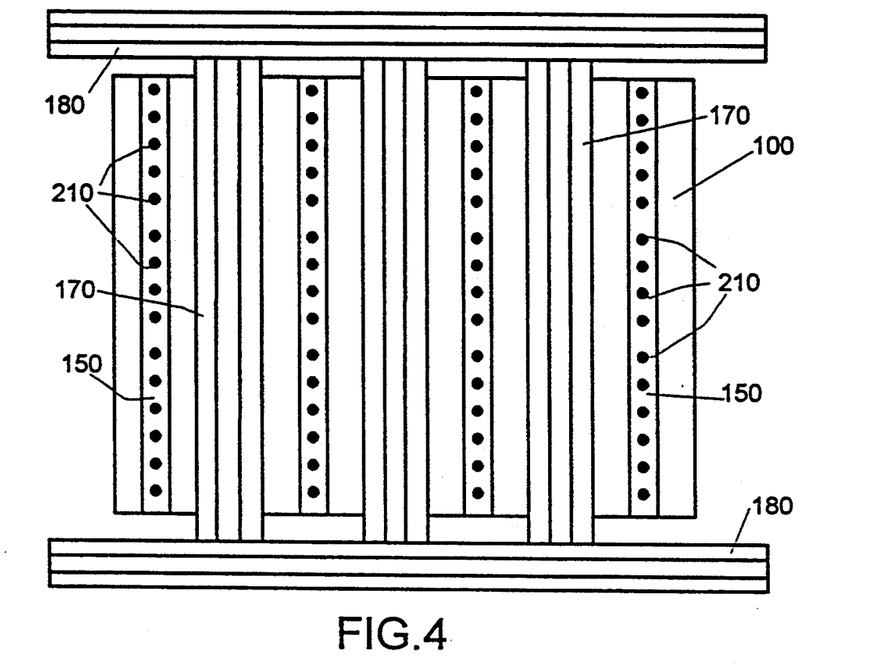
FIG. 4 is a bottom plan view of a multichip module of the present invention.

A plurality of communication bars 150, also referred to as "z-axis connectors" are disposed on the major substrates, such that a communication bar is disposed on each side of each row of IC chips. As shown more clearly in FIG. 2, communication bars 150 provide signal paths interconnecting the chips on different layers of multichip module 10. Additionally, communication bars 150 serve as spacers between adjacent layers. Communication bars 150 comprise a plurality of connection points 210 on their upper and lower surfaces, (upper surface connection points 210 are shown in FIG. 2 and lower surface connection points 410 are shown in FIG. 4). While for clarity only a few such connection points are shown in FIG. 2, it is contemplated that there may be as many as thousands of connections made by each communication bar in some applications of the present invention.

Figure 3:
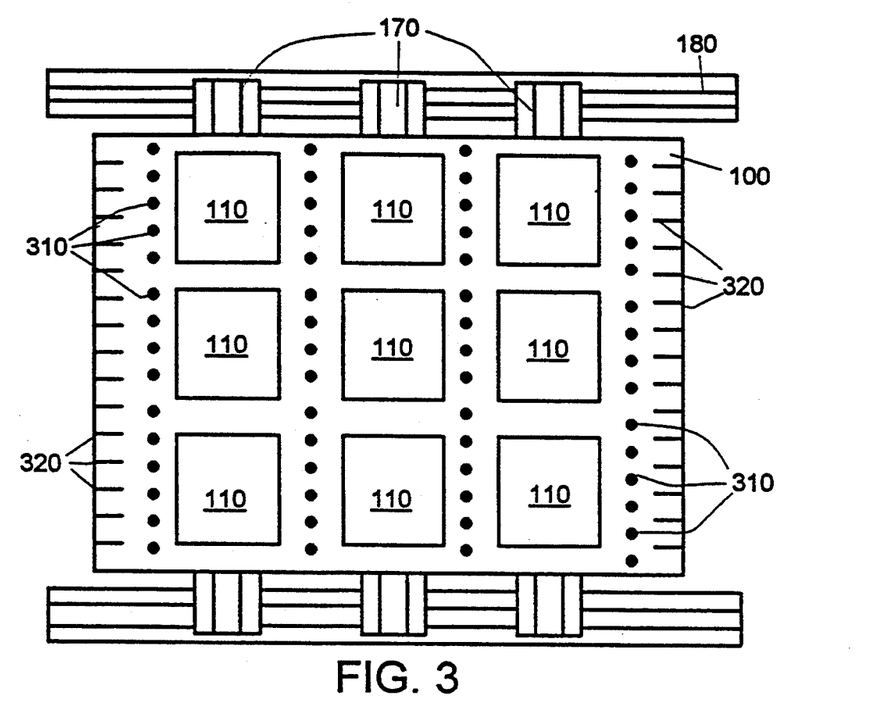
FIG. 3 is a top plan view of a multichip module of the present invention.

In the preferred embodiment, communication bars 150 are separately fabricated, with the connection points being simple, "straight-through" connectors or vias. Corresponding connection points 310 are disposed on either side of the major substrates 100, as shown in FIG. 3. Each communication bar 150 is permanently soldered (or otherwise connected) to one side of the major substrate after first bringing the connection points 310 on a major substrate 100 into registration with the connection points 210 on one side of the communication bar. Although communication bars 150 are shown for clarity in FIG. 2 as being first mounted on the upper surface of the major substrate, (i.e., the surface containing the active interconnect substrate 130), it is also possible to permanently mount them on the lower surface of a major substrate 100, as shown in FIG. 4. Indeed, there may be advantages to mounting the communication bars first to the rigid substrates 120. Whichever way the communication bars are first (permanently) mounted, they are then removably attached to the other side of an adjacent major substrate, again, with corresponding connection points being first brought into registration. One well known method of removable attachment is soldering. Removably attaching the communication bars allows repair and replacement of both the bars and of components on individual layers.

In an alternate embodiment, rather than attaching both sides of the communication bars 150 to major substrates 100, an elastomeric connector (not shown) may be used between communication bars 150 and the major substrate 100 in the location where it is to be removably attached. A variety of elastomeric connectors are commercially available. For example, the "Zebra Connector" sold by Tecknit Interconnection Products of Cranford, N.J., may be suitable for certain applications.

Communication bars 150 may be made by a variety of known techniques and materials. For example, co-fired ceramics may be used. A communication bar suitable for practicing the present invention may be formed by the following steps which are typical of co-fired ceramic technology. First a large planar "green" sheet of a suitable ceramic material is formed. The thickness of the sheet should generally be as large as is possible, but may be limited by the techniques used for forming holes in the sheet. For example, the ceramic sheet may be eight mils thick. Holes of a desired diameter, for example, six mils, are formed in the sheet by any of a number of known means such as laser or mechanical drilling, or simply by a mechanical punch. The size and spacing of the holes is determined by the number of connections which are desired as well as the desired width of the communication bars. A hole-to-hole pitch of 15 mils may be obtained in this manner. The holes are then filled with conductive material such as a paste of glass and powdered tungsten or other refractory metal. The ceramic sheet is then cut into pieces, each of which will have, after the firing step described below, the desired width and depth of a communication bar. These pieces are then stacked to a desired height. When stacking the pieces it is necessary that the filled holes are maintained in proper alignment so that a continuous conductive path is created from the top to the bottom of the communication bar. Using presently available techniques, dozens of layers can be stacked in this manner. The whole assembly is then fired at high temperature to form the communication bar. Thereafter, solder bumps, or other connectors, may be attached to either end of the conductive paths. While one method of forming the communication bars of the present invention has been described, any structure wherein the required number of interconnects can be reliably formed may be suitable. Preferably, the communication bars should have a coefficient of thermal expansion which is close to that of the substrate.

As is shown in FIG. 1, a plurality of channels 160 having a generally rectangular cross-section are formed between adjacent major substrates 100 when the substrates are stacked. The walls of the channels comprise communication bars 150 and the surfaces of the major substrates 100. A cooling fluid, preferably a non-corrosive, non-conductive liquid such as one of the various compounds sold by the 3M company under the florinert TM trademark, is forced through channels 160 by conventional means (not shown). An inactive "lid" substrate (not shown), which need not provide any signal routing, may be placed over the top layer to form cooling channels therein. Likewise, the communication bars on the top layer, if not required for signal routing, may be inactive.

An important feature of the present invention is the fact that the integrated circuit chips 110 are disposed within channels 160 such that the cooling fluid comes in direct contact with each of them. In known prior art multichip modules, the individual IC chips are encased or otherwise sealed so that heat must first flow through a solid before being removed by a cooling fluid. This technique is less efficient, thereby limiting the power that can safely be handled by the multichip module. A multichip module of the present invention is intended to handle current densities in excess of 100 amperes per square centimeter, generating power in excess of 125 watts per square centimeter. (While power densities are typically expressed in terms of area, when dealing with a three-dimensional structure it makes sense to express power densities on a volumetric basis. The present invention is intended to handle volumetric power densities in excess of 135 watts per cubic centimeter.)

The cooling channels of the present invention are, thus, formed in the process of stacking layers 100 of the three dimensional module of the present invention. In other words, neither special structures nor special processing is required in order to form the channels.

Multichip module 10 of the present invention also incorporates novel means for delivering power to the IC chips 110 mounted on each of the major substrates 100. A power strap 170 is mounted below each row of chips, on the opposite face of the major substrate 100, directly beneath the chips in a row. Preferably, the power straps comprise relatively thick copper pieces, as described in greater detail below. As shown in FIG. 2, power is linked from the power straps 170 straight through the major and intermediate substrates 110, 140, directly to IC chips 110. Thus, the path from the power straps 170 to the IC chips 110 is minimized. In this way, the overall structure for supplying power to the chips can be made to be very low impedance. Given the very high current densities described above, a structure for low impedance power distribution is highly beneficial. It is estimated that in one embodiment of the present invention, the power distribution structure delivers power to the chips along a path having less than one hundred milliohms of resistance from the farthest corner of a major substrate 100 to the center point chip surface connection, i.e., the longest path that is present in the structure.

Power straps 170 are, in turn, connected to power feed straps 180 as shown in FIGS. 3 and 4. Power feed straps 180 run parallel to edges of major substrates 100, orthogonal to the power straps 170. Power feed straps 180 may be similar in construction to the power straps 170 as is described in greater detail below. The power straps 170 and the power feed straps 180 contain multiple paths so that a plurality of operating voltages can be supplied to chips 110.

It is also noted that the means for supplying power to the chips in the multichip module of the present invention generally keeps the power supply lines well separated from the signal lines to and from the chips. The only area in which the power supply and signal lines come into close proximity is between the power supply straps and the chips. As noted above, the path between the straps and the chips is relatively short and straight, so that the region of proximity is minimized. In contrast, prior art multichip modules generally use the same active interconnect substrate for carrying both signal and power supply lines. This leads to problems when power line noise is coupled to the signal lines. Moreover, routing power lines through the active interconnect substrate precludes the use of relatively thick supply lines, thereby increasing the impedance, further exacerbating noise and heat formation problems.

Figure 5:
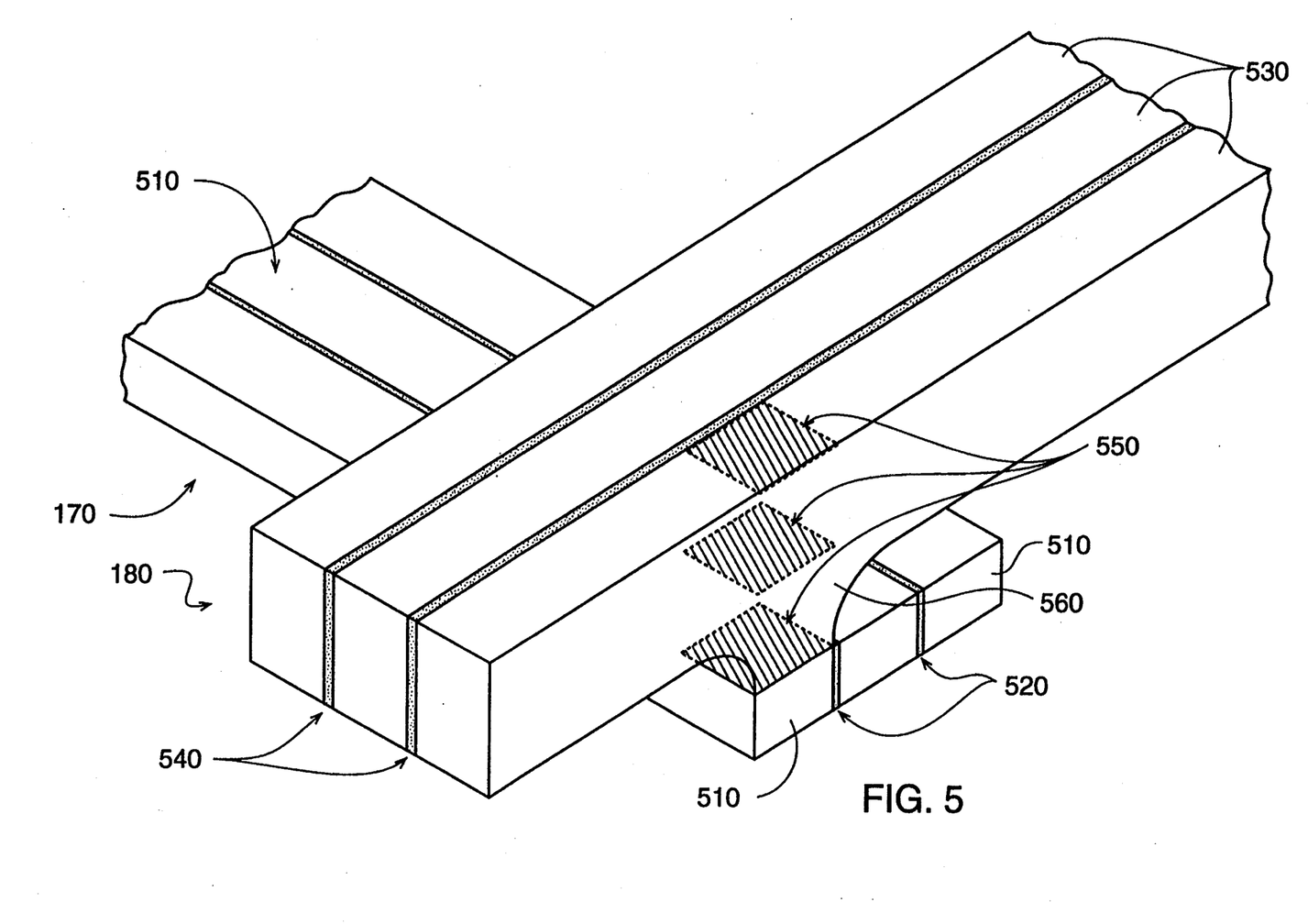
FIG. 5 is a partial perspective view of one embodiment of power supply straps and power feed straps for use in the present invention.

One embodiment of the power straps 170 and power feed straps 180 of the present invention is shown in FIG. 5. In the FIG. 5 embodiment each of the power straps 170 comprises a plurality of copper bars 510, separated by a plurality of insulating spacers 520. Likewise, each of the power feed straps 180 comprises a plurality of copper bars 530, separated by a plurality of insulating spacers 540. Each of the copper bars 510 comprising power strap 170 is electrically connected to a corresponding copper bar 530 of power feed strap 180 as shown by contacts 550. Copper bars 530 have contact extensions 560 which are used to contact copper bars 510. The electrical connection between the copper bars 510 of the power straps and the copper bars 530 of the power feed straps may be made by any known means, for example, by brazing at locations 550. Equivalently, contact extensions could be formed on copper bars 510 rather than copper bars 530. The manner of connecting copper bars 510 to the major substrates 100 will be described below.

While the power straps 170 and power feed straps 180 of FIG. 5 are shown having three copper bars, it will be apparent to those skilled in the art that the number of bars may be varied according to need. Likewise, conductive materials other than copper may be used for the bar material. In the FIG. 5 example, each copper bar is associated with a separate voltage to be provided to the chips, at least one of the bars being a ground return path. In some instances, it may be desirable to use multiple ground lines. In another embodiment, at least five separate voltages and multiple ground paths are utilized.

The copper bars of FIG. 5 may be constructed using a variety of known techniques. For example, a plurality of bars may etched from a single sheet of copper. In one embodiment, the bars have a bottom dimension of 0.15 mm and a vertical dimension of 0.5 mm. Such bars can be wet etched from a 0.15 mm thick copper sheet having a patterned mask layer first disposed thereon. If the etch mask material has suitable insulating properties it can be left in place after the etch step and used as insulators 520 or 540, as the case may be. Alternately, each of the bars may be coated with a conformal dielectric coating, such as parelene, except in locations where they are to be electrically connected. Once formed, copper bars 510 may be electrically connected to the major substrate 100 (as described below) and to copper bars 530. Again these electrical connections may be made by brazing or other known techniques.

Each copper bar 510 or 530 forming an element of a strap does not have to be brazed or otherwise physically attached to the other bars in the same strap, i.e., the bars comprising a strap may be left to move independently. Thus, the straps need not be integral units. Leaving the copper bars unconnected so that they are free to move independently may have advantages in providing strain relief to the overall structure during thermal cycling.

As shown in FIG. 5, it is preferred that copper bars 530 that which comprise the power feed straps 180 are thicker than bars 510 used in the power straps. As shown in FIGS. 3 and 4, there are a greater number of power straps 170 than power feed straps 180. Accordingly, the current carried by the power feed straps is greater.

Figure 6:
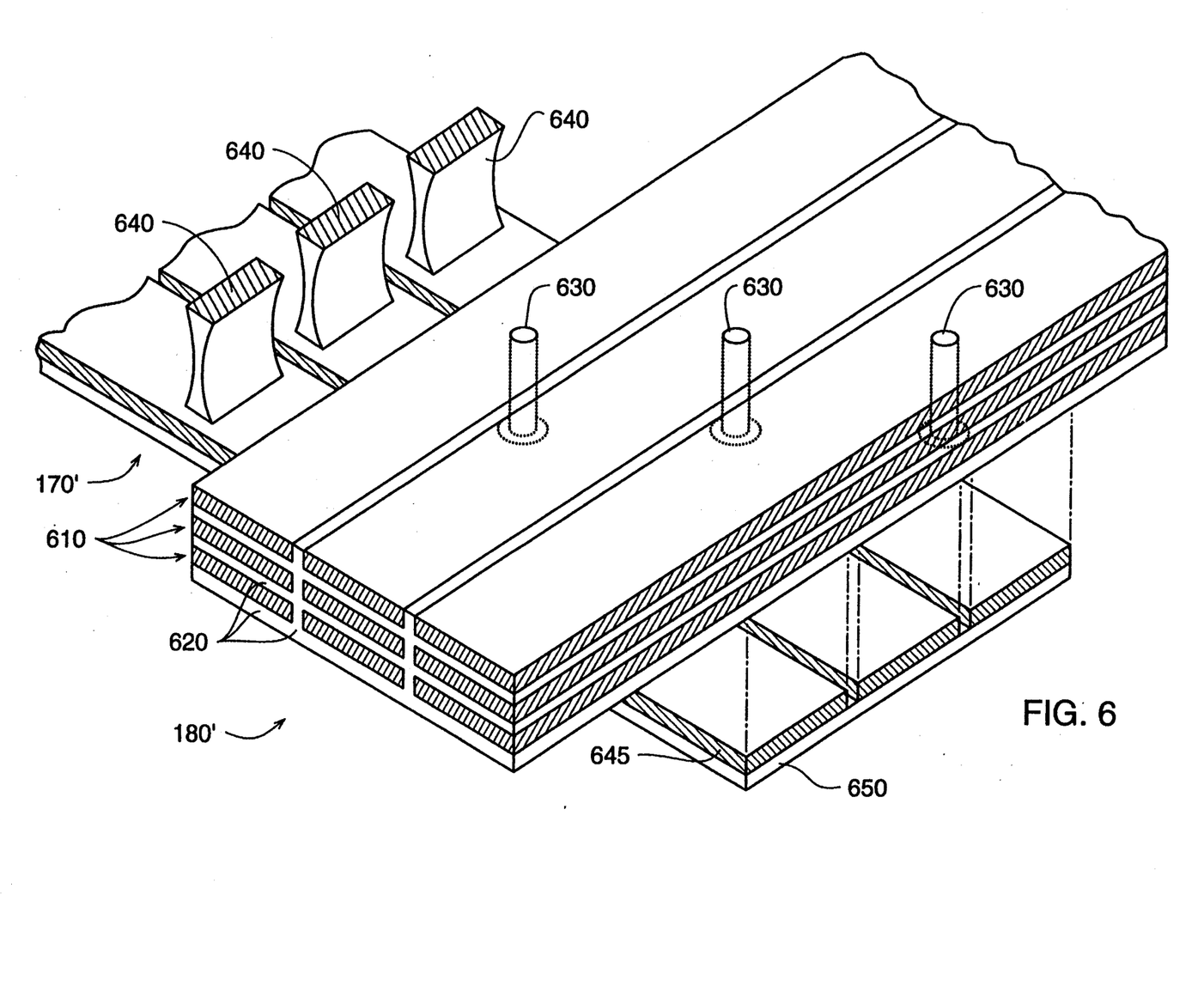
FIG. 6 is a partial isomeric view of another embodiment of power supply straps and power feed straps for use in the present invention.

An alternate embodiment of the power straps 170' and power feed straps 180' is shown in FIG. 6. In the FIG. 6 embodiment, power straps 170' and power feed straps 180' are formed using conventional printed circuit board technology. Each power feed strap 180' comprises a plurality of printed circuit board layers, with each layer comprising a plurality of copper foil strips 610 mounted on and separated by insulation material 620. Insulation material 620 may consist of the printed circuit board substrate material. Via posts 630 interconnect the various copper foil layers in a stack so that the effective thickness of each copper conductive layer is dependent on the number of printed circuit board layers. In addition, via posts 630 may extend downward through the bottom of the printed circuit board layer of power feed straps 180' to connect to the upper copper foil layer of power supply straps 170'.

Power supply straps 170' may be formed in the same way power feed straps 180' are formed, and consist of copper foil strips 645 separated by insulating material 650. Although FIG. 6 shows a power supply strap 170' having only one layer, multiple layers may be used depending on the amount of current that needs to be supplied. The use of multiple layers may be required due to thickness limitations inherent in the printed circuit board technology used to construct the FIG. 6 embodiment.

Each printed circuit board layer should have at least as many copper strips as there are voltages to be supplied to the IC chips, and may have additional strips serving as ground planes. Again, while the exemplary embodiment of FIG. 6 shows three such strips, it is contemplated that additional strips may be used.

In both the embodiments of FIGS. 5 and 6, the upper surface of the copper bars or copper foil, respectively, may be directly connected to connection points on the underside of rigid substrates 120. While rigid substrates 120 are generally not intended to be used for signal or power routing, power is transmitted directly from power straps 170 through substrates 120 and 130 to the intermediate substrates 140 and on to IC chips 110 as is best illustrated in FIG. 2. Techniques for forming straight-through via connections from one side of major substrate 100 to the other are known to those skilled in the art and need not be discussed in detail. The technique utilized will depend on, among other factors, the nature of the material from which the major substrate is formed.

In one embodiment contemplated by the inventors, a plurality of solder bumps are formed on rigid substrate 120 at the locations of the vias which pass through the substrate. These solder bumps are then joined directly to the surface of the copper bars or foil strips using known techniques. Alternately, as shown in FIG. 6, each upper power strap foil strip may have include a plurality of bendable webs 640 mounted thereon. Bendable webs 640 may be electrically attached to the copper foil strips by soldering, welding, brazing, or other known techniques. The bendable webs are positioned to align with the vias in the underside of the rigid substrate 120. After the bendable webs are attached to the foil strips, the entire structure is attached to the major substrate, with the webs being first brought into registration with the vias. Again, solder bumps, braze pads, or other well-known techniques may be used.

Figure 10:
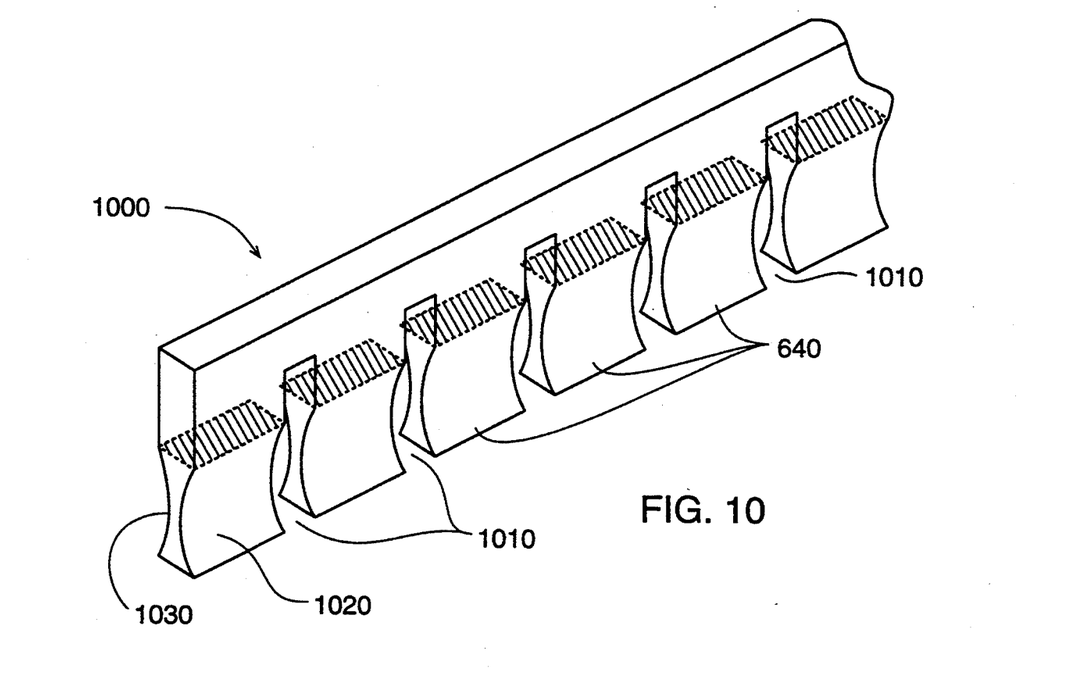
FIG. 10 is a plurality of bendable webs, of the type shown in FIG. 6, at an intermediate stage of fabrication.

The bendable webs shown in FIG. 6 may be constructed and mounted as follows. Referring to FIG. 10, an elongate bar of copper 1000, or other suitable conductive material, having the desired dimensions is first fabricated using known techniques such as roll forming, machining and chemical milling. Concave front and rear faces 1020 and 1030 respectively, are formed in the lower portion of the copper bar, as shown, and a plurality of grooves 1010 are cut in the bar. The grooves are formed so that they do not cut all the way through the bar 1000, thereby forming a plurality of individual web elements attached at their upper ends to a continuous copper segment. The spacing of the grooves is set to equal or exceed the spacing between the foil strips to which they will be attached and the center-to-center distance between the individual web elements is set to match the center-to-center distance between the foil strips to which they will be attached. Bar 1000 is then attached to the foil strips as described above. The bar is then potted in plastic, wax or other suitable material and the upper, continuous portion of the bar is removed by grinding or other machining processes. The potting material is then removed, leaving individual bendable webs 640 attached to the copper foil strips 640.

Bendable webs may similarly be used in connection with the copper bar structure of FIG. 5. Alternately, copper bars 510 may be constructed to include integral connectors similar to contact extensions 560 shown in FIG. 5. An advantage of using bendable webs or contact extensions with either structure is that they provide a greater degree of flexibility to the structure to help relieve material stresses created by thermal cycling and mismatches of the expansion coefficients of the various material used in the overall structure.

Figure 7:
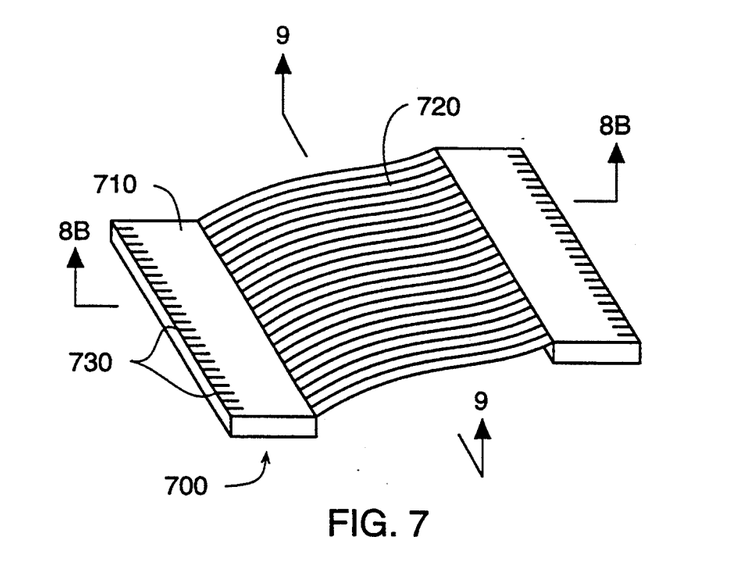
FIG. 7 is a perspective view of an edge connector used in connection of the multichip module of the present invention.

Signal routing to and from three dimensional multichip module 10 is through one or more edge connectors 700 as shown in FIG. 7. Edge connectors 700 include a plurality of connection strips 730 on either side thereof. Alternately, connection points rather than strips may be utilized. Connection strips 730 are configured to align with corresponding connection strips 320 on one or more of the major substrates as shown in FIGS. 2 and 3. The number of edge connectors required will depend on the number of overall connections required between multichip module 10 and external devices as well as the overall density of connection strips per edge connector. While several connection strips 730 are shown, the actual number of connection strips may be as high as several thousand per edge connector depending on the application.

Edge connectors 700 are generally flexible. Although the edge connectors of the present invention are novel, they may be fabricated using known techniques. One fabrication method involves using a generally rectangular semiconductor substrate, such as silicon, over which layers of copper and polyimide are formed. The copper layers are patterned to form the necessary signal lines. If very high speed devices are used, copper signal lines may be situated between copper return lines to provide a controlled impedance similar in effect to a coaxial cable. In this configuration there are at least three copper layers and at least two polyimide layers formed on a semiconductor substrate. The signal lines are relatively uncomplicated to construct since all that is required is a straight path from one end of the edge connector to the other. The other end of the edge connector is connected to secondary devices which do not need to be in immediate proximity with the chips housed in the multichip module. For example, the IC chips in the multichip module may all be CPU chips, while the secondary devices may be memory chips.

After the structure is fabricated, a generally rectangular central portion 720 of the semiconductor substrate may be removed, as by etching, so what remains consists only of the Cu/PI film which is relatively thin and, hence, quite flexible, but which is sufficiently strong for edge connectors of the present invention. The semiconductor substrate is not etched away from end portions 710 of the edge connector, so that these portions retain much greater rigidity which is needed to maintain proper alignment of the connector strips 730 with corresponding connection points 320 on major substrate 100 and with connection points on the external device/circuit.

Figure 8A:
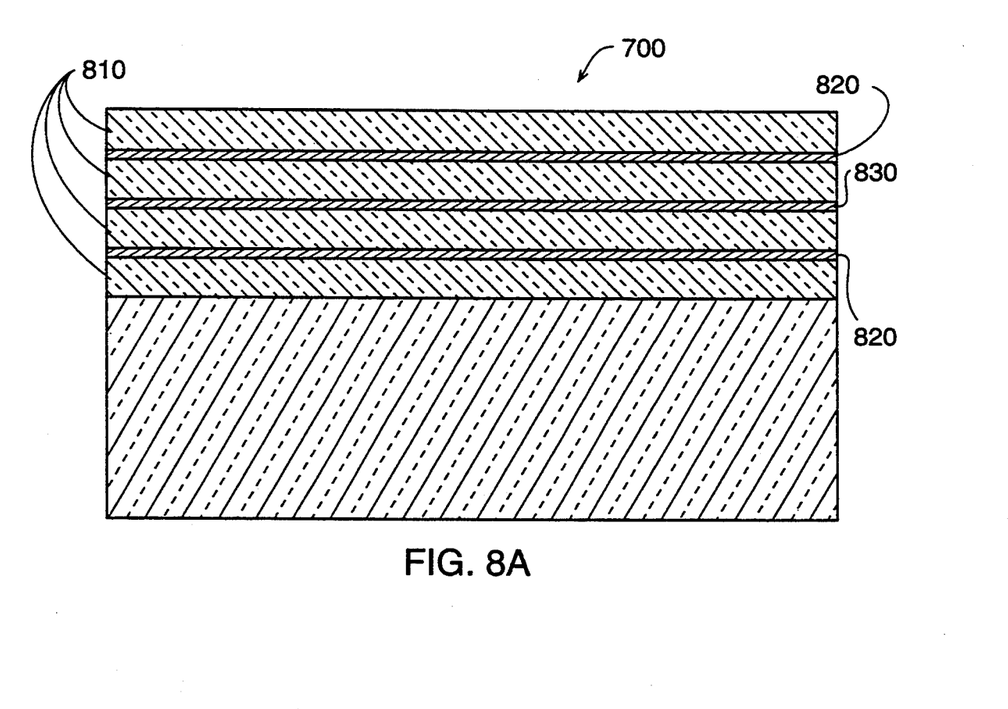
FIG. 8A is an enlarged elevational view of an embodiment of the edge connector of FIG. 7, at an intermediate stage of fabrication, in greater detail.
Figure 8B:
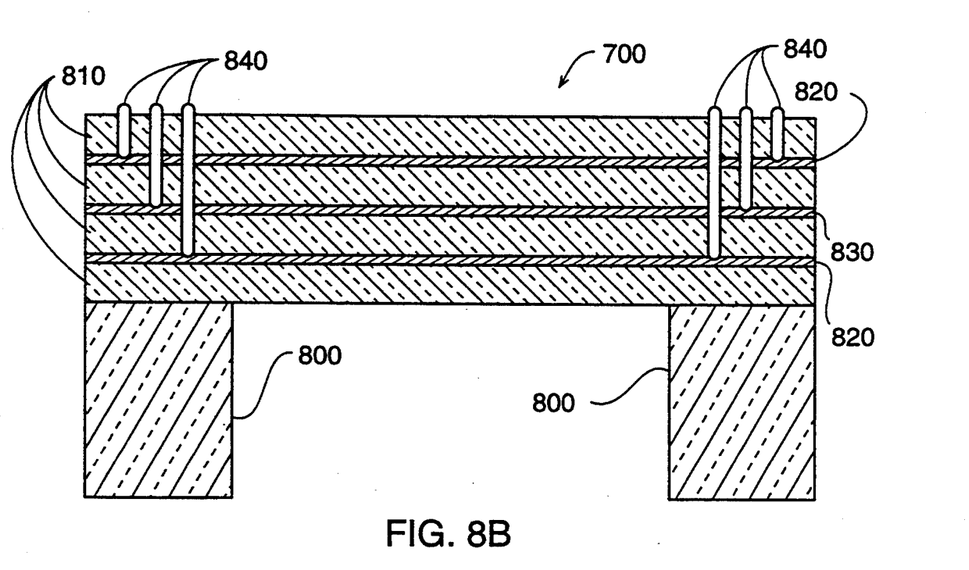
FIG. 8B shows one embodiment of a completed edge connector of FIG. 8A.
Figure 8C:
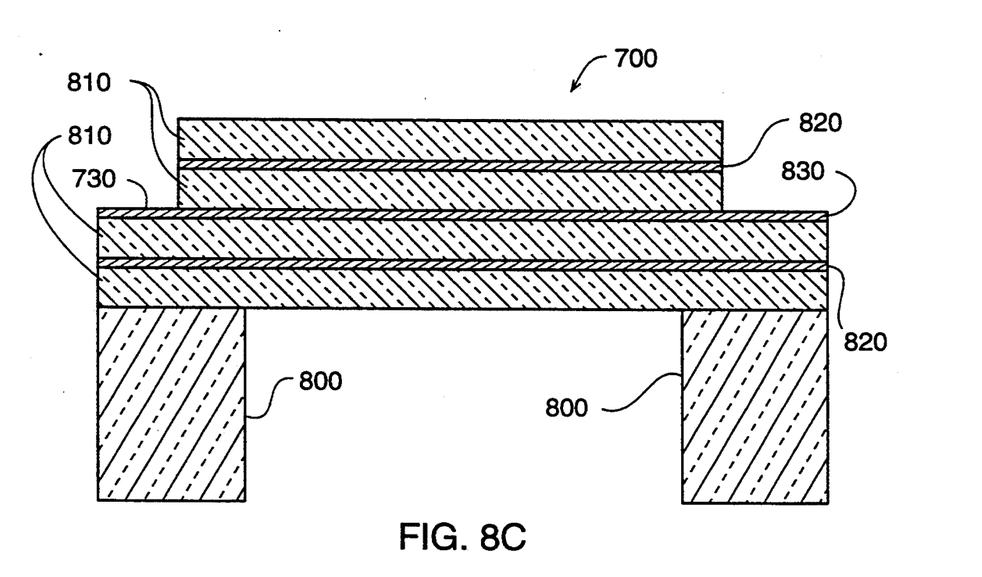
FIG. 8C shows another embodiment of a completed edge connector of FIG. 8A.

More detailed views of two embodiments of the edge connector of the present invention are shown in FIGS. 8A, 8B and 8C. FIG. 8A shows the edge connector at an intermediate stage of fabrication using the process described above. For clarity, the layers are not drawn to scale, and, in particular, the thicknesses of the metal and polyimide layers are relatively exaggerated. Edge connector 700 comprises a semiconductor substrate 800, upon which layers of polyimide and copper have been formed. Polyimide layers 810 separate and overlie copper layers 820 and 830. The uppermost and lowest polyimide layers serve primarily as a protective coating.

The copper layers comprise upper and lower ground plane layers 820, between which is positioned a copper signal strip 830. By controlling the thickness of the polyimide layers separating the ground plane layers from the signal strip a desired impedance may be obtained, much in the same manner that a coaxial cable is formed. While copper ground plane layers 820 may be formed as sheets which extend the entire width of the edge connector, copper signal strips 830 are narrow and are separated from each other by an insulation material 910, as shown in FIG. 9, such as polyimide.

Figure 9:
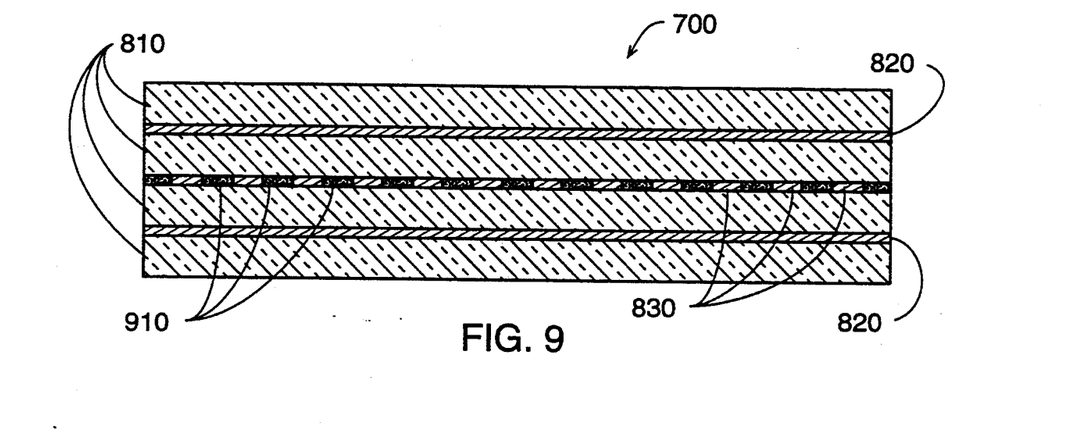
FIG. 9 is a cross section of the edge connector of FIG. 7, taken across view line 9—9.

Turning to FIG. 9, an enlarged cross section of the central portion of the flexible edge connector is shown. Again, ground plane layers 820 surround and are insulated from signal lines 830, which are separated by insulation material 910. Thus, a large number of discreet signal paths are provided across the width of the edge connector.

FIG. 8B shows one embodiment of the edge connector of FIG. 8A after fabrication has been completed. As described above, the central portion of substrate 800 has been removed, as by etching, so as to leave a structure having a flexible center between two relatively thick, rigid end portions 710. Via connectors 840 are formed allowing electrical connection between the upper surface of edge connector 700 and the various metal layers 820 and 830. It will be recognized that separate via connectors are required for each of the signal paths. While, for exemplary purposes vias 840 are all shown in the same cross sectional plane, as a practical matter it is preferred that they be constructed in different planes. Strip connectors 730 (not shown in FIG. 9) may then be formed on top of via connectors 840. In addition, vias 840 are surrounded by insulating material so that they do not short out the various metal layers they pass through.

In the embodiment of FIG. 8C the layers overlying signal strip 830 have been removed to expose the end portion of the signal strip 730, thereby facilitating connection of signal strip 830 to matching connection strips 320 located on three dimensional module 10. Vias may then be used to connect ground plane layers 820 to signal strips on surface 730. It will be apparent to those skilled in the art that other methods for forming connecting strips 730 may be used.

While the use of semiconductor substrates has been described, it will be apparent to those skilled in the art that other substrate materials are also suitable. Likewise, the use of Cu/PI materials for constructing the signal routing structure is not required.

While the present invention has been described with reference to the preferred embodiments thereof, it will be apparent to those skilled in the art that there are many equivalents and alternatives to the precise structures described herein. Accordingly, it is intended that the above specification not be limiting and that the invention be understood solely in reference to the following claims.

What is claimed is:

1. A multichip module for mounting a plurality of integrated circuit chips, comprising:
   a plurality of substantially planar major substrates stacked in generally parallel spaced apart layers to form a three dimensional array, each said substrate having first and second major surfaces on opposite sides thereof and having a plurality of enclosed cooling channel means formed on a major surface thereof, each said cooling channel means having an input end and an output end for flowing a cooling fluid therethrough, each said major substrate forming a part of a cooling channel means;
   a plurality of vertical communication bars mounted in substantially parallel relationship on a major surface of each said major substrate, each said vertical communication bar forming part of a cooling channel means;
   a plurality of integrated circuit chips mounted in a row within each said cooling channel means such that when a cooling fluid is flowed through said cooling channel means, said cooling fluid comes in direct contact with each of said integrated circuit chips;
   wherein said vertical communication bars comprise interconnection means for interconnecting the integrated circuit chips mounted on different major substrates.

2. The multichip module of claim 1 wherein each said integrated circuit chip has active devices formed on a surface thereof and is mounted such that the surface of the integrated circuit chip having active devices is positioned in opposing relationship to the major substrate upon which it is mounted.

3. The multichip module of claim 1 further comprising at least one intermediate substrate mounted on each said major substrate and wherein at least one of said integrated circuit chips is mounted on said at least one intermediate substrate.

4. The multichip module of claim 3 wherein only one integrated circuit chip is mounted on each intermediate substrate.

5. The multichip module of claim 4 wherein each said intermediate substrate is substantially the same size as the integrated circuit chip mounted upon it.

6. A multichip module for mounting a plurality of integrated circuit chips, comprising:
   a major substrate having an enclosed cooling channel means formed thereupon, said cooling channel means having an input end and an output end for flowing a cooling fluid therethrough, said major substrate forming a part of the cooling channel means;
   a plurality of integrated circuit chips mounted in a row within said cooling channel means such that when a cooling fluid is flowed through said cooling channel means, said cooling fluid comes in direct contact with each of said integrated circuit chips;
   power supply connection means for delivering power from an external power supply to said integrated circuit chips wherein said power connection means comprises at least one elongate, generally rectangular power supply strap for supplying electrical power to said integrated circuit chips, said power supple strap being mounted on the opposite side of said major substrate from said integrated circuit chips, and having a width that is narrower than the width of said substrate; and, signal connection means for communicating input and output signals between said integrated circuit chips and external devices, wherein each said substrate is generally flat defining substantially planar major surfaces surrounded by a peripheral edge and said at least one power supply strap has an end portion extending beyond said peripheral edge of each said major substrate and further comprising at least one power feed strap connected to said end portion for delivering electrical power to said at least one power supply strap, each said power feed strap running generally orthogonal to each said power supply strap.

7. The multichip module of claim 6 wherein there are a plurality of cooling channel means formed on each said major substrate and there are an equal number of power supply straps and cooling channel means, each said power supply strap being mounted parallel to and beneath one of said cooling channel means.

8. The multichip module of claim 6 wherein said at least one power supply strap comprises laminated metal bars.

9. The multichip module of claim 6 wherein at least one major substrate is generally rectangular and wherein said signal connection means comprises at least one edge connector, said at least one edge connector being located adjacent to an edge of said major substrate orthogonal to the edge said at least one power supply strap extends beyond.

10. A three-dimensional multichip module for housing a plurality of integrated circuit chips comprising:

a plurality of stacked generally rectangular major substrates having first and second major surfaces surrounded by an edge, said major substrates comprising interconnection means for communicating signals among the integrated circuit chips within said multichip module;

a plurality of communication bars mounted in parallel on a major surface of each major substrate, the communication bars mounted on any given substrate having substantially the same height such that said stacked substrates form a plurality of cooling channels between adjacent substrates and adjacent communication bars, the communication bars forming two walls of each cooling channel, at least some of said communication bars comprising means for electrically coupling integrated circuit chips on different major substrates;

a plurality of integrated circuit chips mounted on the first surface of each major substrate, said integrated circuit chips being mounted in said cooling channels such that when cooling fluid flows through said cooling channels said fluid directly contacts said integrated circuit chips; and a plurality of power supply straps mounted substantially parallel to one another on the second major surface of each said major substrate, each said power supply strap having an end which extends beyond the edge of the major substrate which it is mounted upon.

11. The multichip module of claim 10 wherein each power supply strap is mounted parallel to and below one of said cooling channels.

12. The multichip module of claim 10 further comprising power feed straps connected to a plurality of the ends of the power supply straps, said power feed straps running generally outboard of said major substrates and orthogonal to said power supply straps.

13. The multichip module of claim 10 further comprising at least one edge connector for communicating signals between said integrated circuit chips and devices external to said multichip module, each edge connector being positioned on an edge of a major substrate orthogonal to the edges beyond which said power supply straps extend.

14. The multichip module of claim 10 comprising a plurality of intermediate substrates mounted upon said major substrates, at least one of said integrated circuit chips being mounted upon each said intermediate substrate.

15. The multichip module of claim 14 wherein said intermediate substrates comprise capacitive and resistive means connected to each integrated circuit chip mounted thereon, and whereby all connections to and from each integrated circuit chip mounted on an intermediate substrate are routed through the respective intermediate substrate.

16. The multichip module of claim 14 wherein only one integrated circuit chip is mounted on each said intermediate substrate, and each said intermediate substrate is substantially the same size as the integrated circuit chip mounted thereon.

17. The multichip module of claim 16 wherein all of said integrated circuit chips are substantially the same size.

18. The multichip module of claim 17 further comprising a plurality of power supply straps mounted in parallel on the second surfaces of said major substrates.

19. A multichip module for housing a plurality of integrated circuit chips, comprising:

a plurality of generally rectangular major substrates having first and second major surfaces on opposite sides thereof, each first surface having a plurality of integrated circuit chips mounted thereon in at least one row, at least one separately fabricated, elongate, generally rectangular power supply strap for providing a plurality of different electrical potentials to each of said integrated circuit chips, each said power supply strap being mounted on the second surface of each major substrate generally below and parallel to each said row of integrated circuit chips, each said power supply strap having a width less than the width of said substrate, wherein each said power supply strap has a plurality of generally flat electrically isolated upper surface regions, each such upper surface region being electrically coupled to said major substrate, each electrically isolated upper surface region having one of said electrical potentials associated therewith, such that each of said electrical potentials can be provided to said major substrate without being routed through a layer within said power supply strap carrying a different electrical potential; and a plurality of communication bars for communicating signals among different integrated circuit chips within said multichip module, said communication bars being mounted on a major surface of each said major substrate, each said communication bar being positioned parallel to and along a side of a row of integrated circuit chips.

20. The multichip module of claim 19 wherein said major substrates are stacked, such that channels are formed between adjacent substrates, the walls of said channels being comprised of adjacent communications bars and adjacent major substrates, such that each said row of integrated circuit chips is located within one of said channels.

21. The multichip module of claim 19 wherein each major substrate comprises a plurality of layers which are generally coplanar with said first and second major surfaces and wherein each said power supply strap comprises laminated metal bars, the laminations defining planes that are generally orthogonal to said major substrate layers.

22. The multichip module of claim 19 wherein each said power supply strap has ends which extend beyond the edges of said major substrate, said power supply strap ends being connected to power supply feed straps positioned outboard of said major substrate and running generally orthogonal to said power supply straps.

23. The multichip module of claim 19 wherein at least one of said integrated circuit chips is mounted on an intermediate substrate which is mounted on a major substrate.

24. A multichip module for housing a plurality of integrated circuit chips, comprising:
a plurality of generally rectangular major substrates having first and second major surfaces on opposite sides thereof,
at least one row of integrated circuit chips mounted on the first major surface of each substrate,
a plurality of communication bars mounted on a major surface of each said major substrate, said communication bars being mounted parallel to each said row, at least one communication bar being positioned adjacent to each edge of each said at least one row, such that channels are formed between adjacent substrates, said communication bars comprising signal paths for electrically coupling integrated circuit chips located on different substrates,
at least one edge connector located adjacent to an edge of one of said major substrates, said edge connector comprising signal paths for electrically coupling said integrated circuit chips mounted in said multichip module with external devices,
power distribution means mounted on said second major surface of each of said substrates for supplying a plurality of electrical potentials to said integrated circuit chips, said power distribution means being separated from said communication bars and each edge connector.

25. The multichip module of claim 24 wherein said power distribution means comprises a plurality of power distribution straps mounted on the second surface of each said major substrate parallel to and generally opposite said integrated circuit chip rows.

26. The multichip module of claim 25 further comprising a plurality of power feed straps connected to said power supply straps at ends thereof outboard of said major substrates.

27. The multichip module of claim 24 comprising a plurality of intermediate substrates interposed between said integrated circuit chips and each said major substrate, such that all power and signal routing to and from said integrated circuit chips occurs through said intermediate substrates.

28. A three dimensional multichip module comprising a plurality of generally rectangular integrated circuit chips mounted on a plurality of generally planar substrates defining an x–y plane, said integrated circuit chips defining functional units, each functional unit comprising one or more integrated circuit chips, said substrates further comprising signal path means for interconnecting said integrated circuit chips, said signal path means running generally parallel to one of the x, y and z axes, wherein the number of chips mounted on each substrate ($N_b$) is in accordance with the following equation:

$$N_b = [2 N_s N_F P_z V_{xy} / (P_x + P_y) V_z]^{\frac{2}{3}}$$

where $N_F$ is the number of chips per functional unit in the module, $P_x$ and $P_y$ are the chip-to-chip pitch in the x and y directions, $P_z$ is the center-to-center distance between adjacent substrates in the z direction, $N_s$ is the number of functional units which communicate with other functional units, and $V_{xy}$ and $V_z$ are the velocity of electromagnetic wave transmission through said signal path means in the xy and z directions, respectively.

* * * * *